US009589853B2

(12) United States Patent
Titus et al.

(10) Patent No.: US 9,589,853 B2
(45) Date of Patent: Mar. 7, 2017

(54) METHOD OF PLANARIZING AN UPPER SURFACE OF A SEMICONDUCTOR SUBSTRATE IN A PLASMA ETCH CHAMBER

(71) Applicant: Lam Research Corporation, Fremont, CA (US)

(72) Inventors: Monica Titus, Sunnyvale, CA (US); Gowri Kamarthy, Pleasanton, CA (US); Harmeet Singh, Fremont, CA (US); Yoshie Kimura, Castro Valley, CA (US); Meihua Shen, Fremont, CA (US); Baosuo Zhou, Redwood City, CA (US); Yifeng Zhou, Fremont, CA (US); John Hoang, Fremont, CA (US)

(73) Assignee: LAM RESEARCH CORPORATION, Fremont, CA (US)

( * ) Notice: Subject to any disclaimer, the term of this patent is extended or adjusted under 35 U.S.C. 154(b) by 13 days.

(21) Appl. No.: 14/337,953

(22) Filed: Jul. 22, 2014

(65) Prior Publication Data

US 2015/0249016 A1 Sep. 3, 2015

Related U.S. Application Data

(60) Provisional application No. 61/946,399, filed on Feb. 28, 2014.

(51) Int. Cl.
*H01L 21/00* (2006.01)
*H01L 21/3065* (2006.01)
*H01L 21/66* (2006.01)
*H01L 21/67* (2006.01)
*H01L 21/311* (2006.01)

(52) U.S. Cl.
CPC .......... *H01L 22/12* (2013.01); *H01L 21/3065* (2013.01); *H01L 21/31116* (2013.01); *H01L 21/67103* (2013.01); *H01L 22/20* (2013.01)

(58) Field of Classification Search
CPC ........... H01L 21/3065; H01L 21/31116; H01L 21/67103; H01L 22/12
USPC ......................................................... 438/85
See application file for complete search history.

(56) References Cited

U.S. PATENT DOCUMENTS

| 6,265,315 B1 | 7/2001 | Lee et al. |
| 6,498,107 B1 | 12/2002 | Fenner |
| 6,769,961 B1 | 8/2004 | Kistler et al. |

(Continued)

*Primary Examiner* — Duy T Nguyen

(57) ABSTRACT

A method of planarizing an upper surface of a semiconductor substrate in a plasma etch chamber comprises supporting the substrate on a support surface of a substrate support assembly that includes an array of independently controlled thermal control elements therein which are operable to control the spatial and temporal temperature of the support surface of the substrate support assembly to form independently controllable heater zones which are formed to correspond to a desired temperature profile across the upper surface of the semiconductor substrate. The etch rate across the upper surface of the semiconductor substrate during plasma etching depends on a localized temperature thereof wherein the desired temperature profile is determined such that the upper surface of the semiconductor substrate is planarized within a predetermined time. The substrate is plasma etched for the predetermined time thereby planarizing the upper surface of the substrate.

20 Claims, 3 Drawing Sheets

(56) References Cited

U.S. PATENT DOCUMENTS

| | | |
|---|---|---|
| 7,772,110 B2 | 8/2010 | Robison et al. |
| 7,811,939 B2 | 10/2010 | Kushibiki et al. |
| 7,858,495 B2 | 12/2010 | Ohnuma et al. |
| 7,947,157 B2 | 5/2011 | Ravkin et al. |
| 8,178,439 B2 | 5/2012 | Tohnoe et al. |
| 8,193,094 B2 | 6/2012 | Wang |
| 8,202,435 B2 | 6/2012 | Tabat |
| 8,313,663 B2 | 11/2012 | Hautala |
| 8,409,456 B2 | 4/2013 | Lan et al. |
| 8,461,674 B2 | 6/2013 | Gaff et al. |
| 8,492,174 B2 | 7/2013 | Kanarik et al. |
| 8,501,630 B2 | 8/2013 | Metz et al. |
| 8,512,586 B2 | 8/2013 | Tabat et al. |
| 8,604,562 B2 | 12/2013 | Wang |
| 8,624,168 B2 | 1/2014 | Gaff et al. |
| 8,637,794 B2 | 1/2014 | Singh et al. |
| 8,642,480 B2 | 2/2014 | Gaff et al. |
| 8,691,103 B2 | 4/2014 | Hautala |
| 8,791,392 B2 | 7/2014 | Signh |
| 2004/0060899 A1 | 4/2004 | Waldhauer et al. |
| 2004/0099915 A1* | 5/2004 | Takayama ............... B32B 17/04 257/411 |
| 2004/0259328 A1* | 12/2004 | Ito ........................... H01L 22/12 438/459 |
| 2005/0014380 A1* | 1/2005 | Kai .................... H01L 21/31122 438/706 |
| 2009/0182528 A1* | 7/2009 | De Groot ............... G01B 11/06 702/167 |
| 2011/0003460 A1 | 1/2011 | Akiyama et al. |
| 2011/0312180 A1* | 12/2011 | Wang ................. H01L 21/31055 438/692 |
| 2012/0077347 A1* | 3/2012 | Metz ................. H01L 21/76897 438/715 |
| 2013/0040465 A1 | 2/2013 | Meng et al. |
| 2013/0075248 A1 | 3/2013 | Hara et al. |
| 2013/0220989 A1 | 8/2013 | Pease et al. |

* cited by examiner

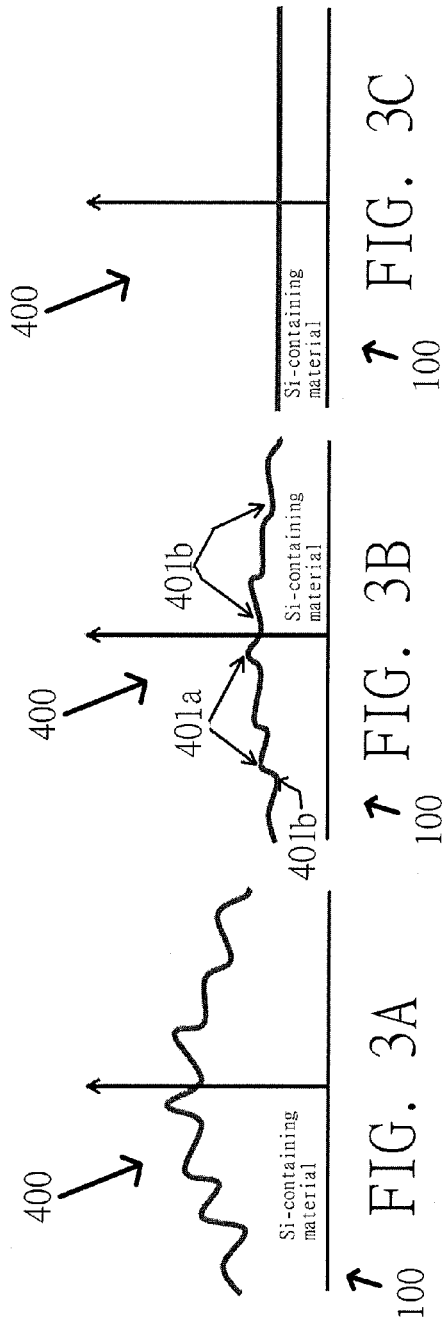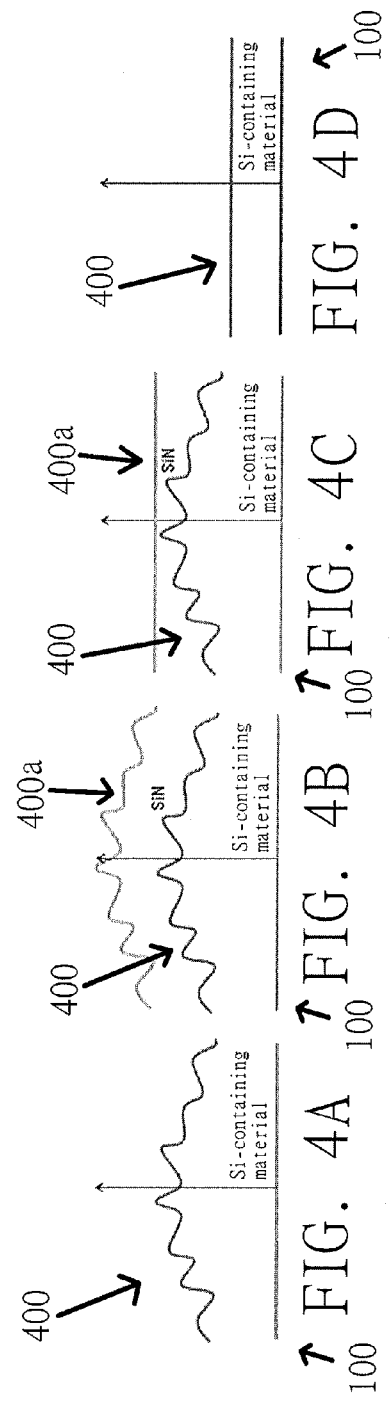

METHOD OF PLANARIZING AN UPPER SURFACE OF A SEMICONDUCTOR SUBSTRATE IN A PLASMA ETCH CHAMBER

CROSS REFERENCE TO RELATED APPLICATIONS

This application claims priority under 35 U.S.C. 119(e) to U.S. Provisional Application No. 61/946,399, filed on Feb. 28, 2014, the entire content of which is hereby incorporated by reference.

FIELD OF THE INVENTION

The invention relates to methods of planarizing an upper surface of a semiconductor substrate in a plasma etch chamber, and more specifically to a method of planarizing an upper surface of a semiconductor substrate while controlling temperatures across the upper surface of the semiconductor substrate.

BACKGROUND

In the fabrication of semiconductor devices such as integrated circuits, memory cells, and the like, a series of manufacturing operations are performed to define features on semiconductor substrates. The semiconductor substrates can include integrated circuit devices in the form of multilevel structures defined on a semiconductor substrate formed from silicon. At a substrate level, transistor devices with diffusion regions are formed. In subsequent levels, interconnect metallization lines are patterned and electrically connected to the transistor devices to define a desired integrated circuit device. Also, patterned conductive layers are insulated from other conductive layers by dielectric materials.

The series of manufacturing operations for defining features on the semiconductor substrates can include many processes such as adding, patterning, etching, removing, polishing, and planarizing among others, various material layers. Due to the intricate nature of the features defined on semiconductor substrates, it is necessary to perform each process in a precise manner. For example, it is often desirable to planarize an upper surface of a semiconductor substrate in a precise manner to decrease variations in surface topography of the upper surface of the semiconductor substrate. Without precise planarization, fabrication of additional layers becomes substantially more difficult due to increased variations in the surface topography of the upper surface of the semiconductor substrate.

SUMMARY

Disclosed herein is a method of planarizing an upper surface of a semiconductor substrate in a plasma etch chamber wherein the semiconductor substrate is supported on a support surface of a substrate support assembly located in the plasma etch chamber. The substrate support assembly includes an array of independently controlled thermal control elements therein. The thermal control elements of the array of independently controlled thermal control elements are operable to control the spatial and temporal temperature of the support surface of the substrate support assembly to form independently controllable heater zones. The independently controllable heater zones are formed to correspond to a desired temperature profile across the upper surface of the semiconductor substrate such that the etch rate across the upper surface of the semiconductor substrate during plasma etching can be controlled so that the upper surface of the semiconductor substrate may be planarized. The method comprises analyzing the upper surface of the semiconductor substrate thereby measuring nonuniformity of surface topography of the upper surface wherein the upper surface is formed by a Si-containing material. An amount of Si-containing material to be removed from the upper surface of the semiconductor substrate is calculated based upon the analysis of the upper surface to achieve a planar upper surface of the semiconductor substrate after plasma etching the semiconductor substrate for a predetermined time. A temperature profile of spatial and temporal temperatures across the support surface of the substrate support assembly is generated. The temperature profile corresponds to desired temperatures across the upper surface of the semiconductor substrate required to remove the calculated amount of Si-containing material from the upper surface of the semiconductor substrate, wherein the etch rate of the Si-containing material forming the upper surface depends on the localized temperature thereof. The semiconductor substrate is inserted into the plasma etch chamber. Process gas is supplied into the chamber and the process gas is energized into a plasma state. The upper surface of the semiconductor substrate is planarized by plasma etching the upper surface of the semiconductor substrate while powering the array of independently controlled thermal control elements to achieve the desired temperature profile across the upper surface of the semiconductor substrate thereby removing the calculated amount of Si-containing material from the upper surface of the semiconductor substrate and achieving a planar upper surface of the semiconductor substrate.

Also disclosed herein is a method of planarizing an upper surface of a semiconductor substrate in a plasma etch chamber wherein the upper surface of the semiconductor substrate is formed by a Si-containing material. The method comprises supporting the semiconductor substrate on a support surface of a substrate support assembly that includes an array of independently controlled thermal control elements therein wherein the thermal control elements of the array of independently controlled thermal control elements are operable to control the spatial and temporal temperature of the support surface of the substrate support assembly to form independently controllable heater zones. The independently controllable heater zones are formed to correspond to a desired temperature profile across the upper surface of the semiconductor substrate wherein the etch rate across the upper surface of the semiconductor substrate during plasma etching depends on a localized temperature thereof and wherein the desired temperature profile is determined such that the upper surface of the semiconductor substrate is planarized within a predetermined time. The semiconductor substrate is plasma etched for the predetermined time thereby planarizing the upper surface thereof wherein the process gas used to perform the plasma etch includes HBr, $C_4F_3$, $NF_3$, $CH_2F_2$, $CF_4$, $CH_3F$, $O_2$, He, $Cl_2$, or a combination thereof.

BRIEF DESCRIPTION OF THE DRAWING FIGURES

Figure 1:
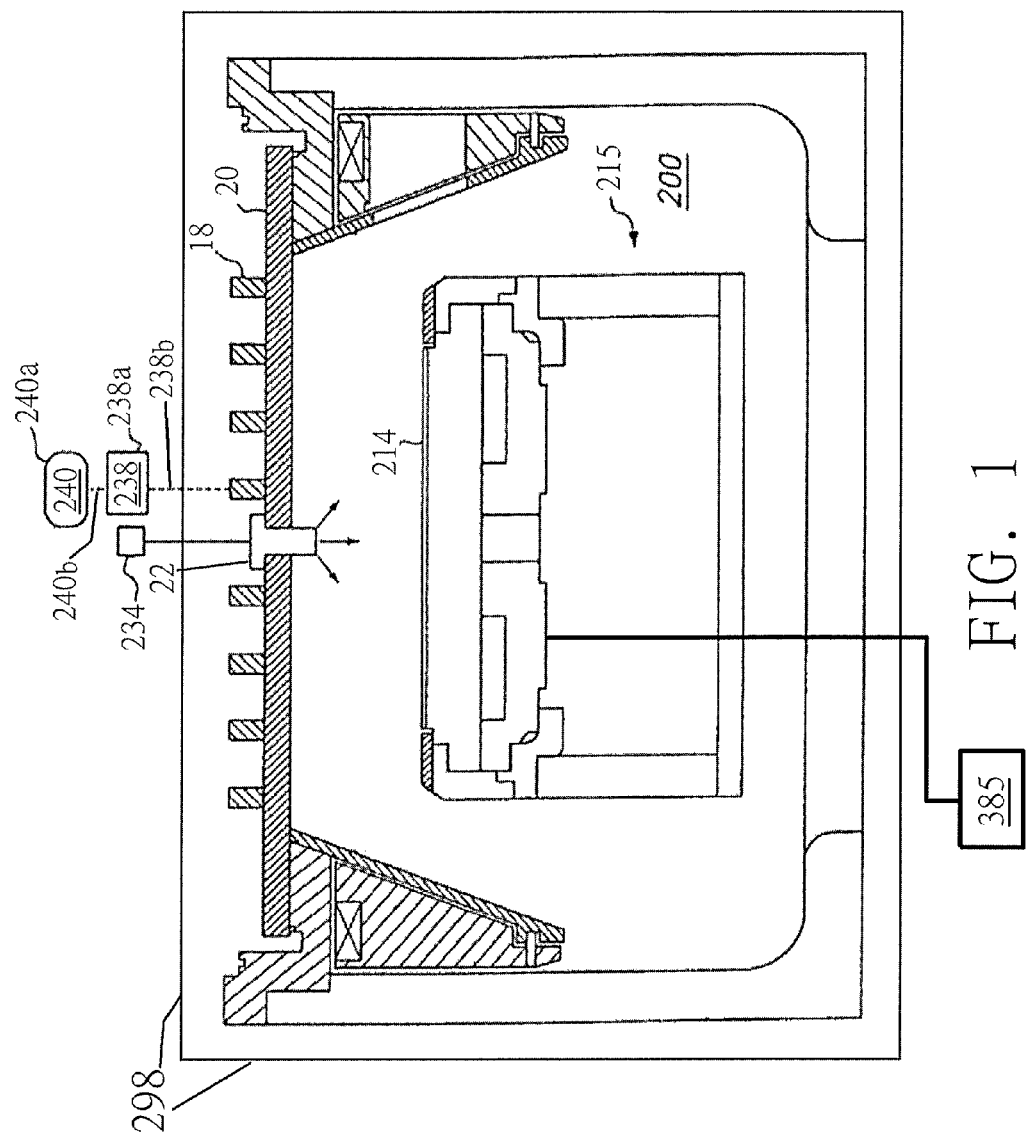
FIG. 1 illustrates an embodiment of an inductively coupled plasma etching chamber in which embodiments of the method of planarizing the upper surface the semiconductor substrate can be performed.

FIGS. 3A-C each illustrate a cross-sectional view of a semiconductor substrate during various method steps of an embodiment of planarizing an upper surface of a semiconductor substrate as disclosed herein.

FIGS. 4A-D each illustrate a cross-sectional view of a semiconductor substrate during various method steps of an embodiment of planarizing an upper surface of a semiconductor substrate as disclosed herein.

DETAILED DESCRIPTION

Disclosed herein is a method of planarizing an upper surface of a semiconductor substrate (substrate) in a plasma etch chamber wherein the semiconductor substrate is supported on a support surface of a substrate support assembly located in the plasma etch chamber which includes an array of independently controlled thermal control elements such as an array of at least 50 independently controlled thermal control elements. In the following description, numerous specific details are set forth in order to provide a thorough understanding of the present embodiments. It will be apparent, however, to one skilled in the art that the present embodiments may be practiced without some or all of these specific details. In other instances, well known process operations have not been described in detail in order not to unnecessarily obscure present embodiments disclosed herein. Additionally, as used herein, the term "about" when used with reference to numerical values refers to ±10%.

The performance of many plasma processing processes depends upon a temperature profile of a semiconductor substrate supported on a support surface of a substrate support assembly. For example, during plasma processing, a substrate support assembly may be configured to tune the spatial and/or temporal temperature profile of a semiconductor substrate supported on the support surface thereof. To tune the semiconductor substrate temperature profile, an array of independently controlled thermal control elements included in the substrate support assembly can be controlled to tune the temperature of the support surface of the substrate support assembly, thereby controlling the temperature profile of the substrate (i.e. temperatures across the upper surface of the semiconductor substrate) supported on the support surface of the substrate support assembly. Exemplary embodiments of substrate support assemblies and heating arrangements (i.e. tuning arrangements) for substrate support assemblies can be found in commonly-assigned U.S. Pat. No. 8,461,674, and commonly-assigned U.S. Published Application Nos. 2011/0092072, 2012/0097661, 2013/0068750, 2013/0220989, and 2011/0143462, and commonly-assigned U.S. patent application Ser. No. 13/908,676, which are hereby incorporated by reference in their entirety. An exemplary embodiment of a power supply and power switching system for a substrate support assembly including an array of independently controlled thermal control elements electrically connected to the power supply and power switching system can be found in commonly-assigned U.S. patent application Ser. No. 13/690,745, which is hereby incorporated by reference in its entirety.

The substrate support assembly can comprise an electrostatic chuck (ESC) useful for electrostatically clamping the semiconductor substrate (substrate) onto the support surface of the substrate support assembly during processing. The substrate support assembly can also comprise a fluid-cooled heat sink (i.e. a cooling plate) and a heater plate including an array of independently controlled thermal control elements operable to form a plurality of independently controllable heater zones to realize step by step and radial temperature control, azimuthal temperature control, and/or die by die temperature control of a substrate supported on the support surface of the substrate support assembly. For example, in an embodiment, the fluid-cooled heat sink can be maintained between about −20° C. and 80° C. wherein the array of independently controlled thermal control elements (heaters) can maintain a support surface, and thereby a substrate supported on the support surface, of the substrate support assembly at temperatures of about 0° C. to 90° C. above the fluid cooled heat sink temperature. By changing the heater power supplied to the thermal control elements, the independently controllable heater zones can be formed such that the temperature profile of the support surface of the substrate support assembly, and thereby the temperature profile of the substrate supported on the support surface of the substrate support assembly, can be controlled. The thermal control elements are preferably independently controllable, wherein the independently controllable heater zones can be formed by the array of independently controlled thermal control elements at a spatial frequency which is independent of the spatial frequency of the thermal control elements of the array of independently controlled thermal control elements included in the substrate support assembly. Preferably the substrate support assembly includes at least 50 thermal control elements therein, and is operable to form at least 100 independently controllable heater zones.

FIG. 1 illustrates an embodiment of an inductively coupled plasma processing apparatus which can perform embodiments of methods of planarizing an upper surface of a semiconductor substrate disclosed herein. The inductively coupled plasma processing apparatus can include a vacuum chamber 200 (i.e. plasma etch chamber). The vacuum chamber 200 includes a substrate support (lower electrode assembly) 215 for supporting a semiconductor substrate 214 in the interior of the vacuum chamber 200. A dielectric window 20 forms a top wall of vacuum chamber 200. Process gases are injected to the interior of the vacuum chamber 200 through a gas injector 22. A gas source 234 supplies process gases to the interior of the vacuum chamber 200 through gas injector 22.

Once process gases are introduced into the interior of vacuum chamber 200, they are energized into a plasma state by an antenna 18 supplying energy into the interior of vacuum chamber 200. Preferably, the antenna 18 is an external planar antenna powered by a RF power source 240 and RF impedance matching circuitry 238 to inductively couple RF energy into vacuum chamber 200. However, in an alternate embodiment, the antenna 18 may be an external or embedded antenna which is nonplanar. An electromagnetic field generated by the application of RF power to planar antenna energizes the process gas in the interior of the vacuum chamber 200 to form a high-density plasma (e.g., $10^9$-$10^{12}$ ions/cm$^3$) above substrate 214. During an etching process, the antenna 18 (i.e. a RF coil) performs a function analogous to that of a primary coil in a transformer, while the plasma generated in the vacuum chamber 200 performs a function analogous to that of a secondary coil in the transformer. Preferably, the antenna 18 is electrically connected to the RF impedance matching circuitry 238 by an electrical connector 238b (i.e. lead) and the RF power source 240 is electrically connected to the RF impedance matching circuitry 238 by an electrical connector 240b.

Figure 2:
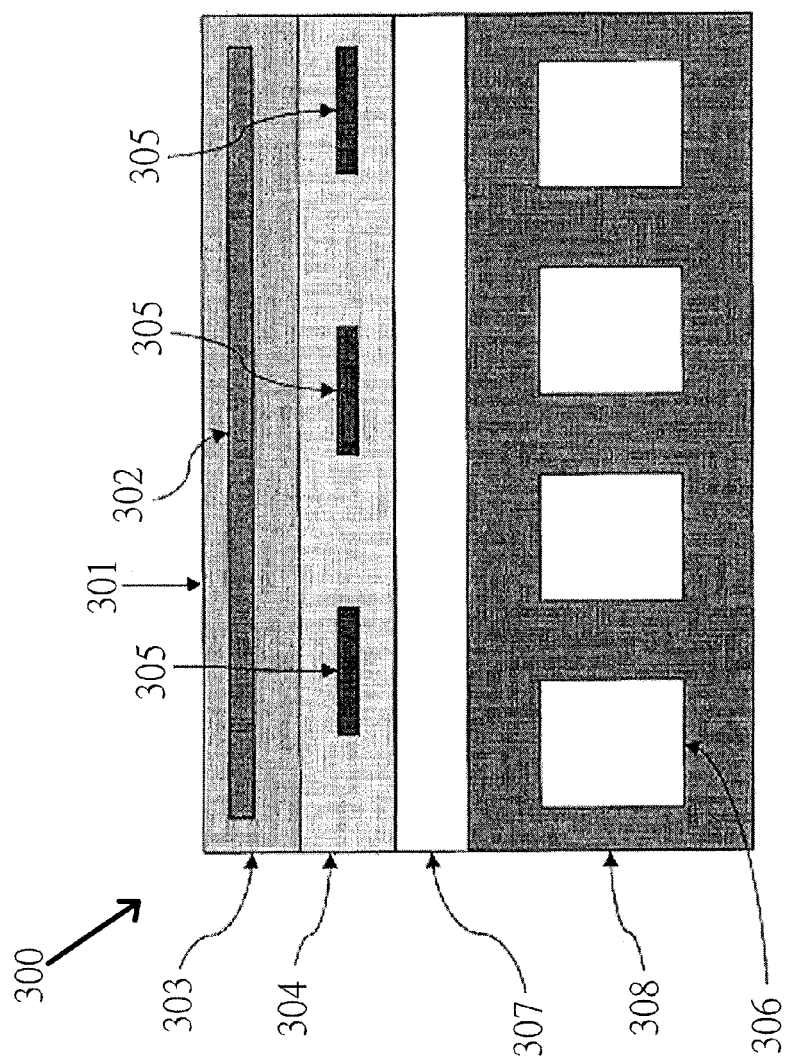
FIG. 2 is a schematic of a cross-sectional view of a substrate support assembly which includes a heating plate having an array of independently controlled thermal control elements therein.

FIG. 2 illustrates a cross-sectional view of an embodiment of a substrate support assembly 300, having a support surface 301, which can be used to perform embodiments of the method of planarizing the upper surface of a semiconductor substrate disclosed herein. The substrate support assembly 300 can include a heating plate 304 having an array of independently controlled thermal control elements therein. Preferably the heater plate 304 includes at least 50 independently controllable thermal control elements 305 therein. The heater plate 304 can be a polymer material, an inorganic material, a ceramic such as silicon oxide, alumina, yttria, aluminum nitride or other suitable material. The substrate support assembly 301 preferably further includes an electrostatic chuck formed by a ceramic layer 303 (electrostatic clamping layer) in which at least one electrode 302 (e.g. monopolar or bipolar) is embedded therein to electrostatically clamp a substrate to the support surface 301 of the ceramic layer 303 with a DC voltage. The substrate support assembly 300 can further include, for example, a thermal barrier layer 307, and a cooling plate 308 containing channels 306 for coolant flow.

The upper surface of a semiconductor substrate supported on the support surface of the substrate support assembly is preferably formed from a material wherein the etch rate of the material depends on a localized temperature thereof. For example, etch rates can be increased at locations across the upper surface of the semiconductor substrate by increasing a localized temperature thereof as compared to surrounding locations across the upper surface of the semiconductor substrate. However, in an alternate embodiment, depending on the material forming the upper surface of the semiconductor substrate, etch rates can be increased at locations across the upper surface of the semiconductor substrate by decreasing a localized temperature thereof as compared to surrounding locations across the upper surface of the semiconductor substrate.

The independently controlled thermal control elements 305 of the array of independently controlled thermal control elements are operable to control the spatial and temporal temperature of the support surface 301 of the substrate support assembly 300 to form independently controllable heater zones. The independently controllable heater zones can be formed at a spatial frequency independent of the spatial frequency of the thermal control elements of the array of independently controlled thermal control elements included in the substrate support assembly. The independently controllable heater zones are preferably formed to correspond to a desired temperature profile across the upper surface of a semiconductor substrate supported on the support surface 301 such that the etch rates across the upper surface of the semiconductor substrate can be controlled during plasma etching so that the upper surface of the semiconductor substrate may be planarized during plasma etching. For example, the array of independently controlled thermal control elements can be powered to form at least 100 independently controllable heater zones, to correspond to a desired temperature profile across the support surface of the semiconductor substrate assembly and thereby the semiconductor substrate supported on the support surface 301 such that the etch rate of portions of the upper surface of the semiconductor substrate corresponding to each formed independently controllable heater zone is about 0 to 5 nm/min/° C. In this manner, the entire upper surface of the semiconductor substrate can be planarized at one time during plasma etching. To control the etch rate of portions of the upper surface of the semiconductor substrate, the temperatures of the independently controllable heater zones across the support surface of the substrate support assembly can preferably achieve temperatures across the support surface of about −20° C. to about 90° C., and more preferably about 20° C. to about 90° C.

Preferably, the upper surface of the semiconductor substrate is formed of a silicon-containing material (as used herein Si-containing material), and more preferably the upper surface of the semiconductor substrate is formed from silicon (Si), for example polysilicon or crystalline silicon, silicon nitride (SiN), or silicon oxide (SiOx wherein x is greater than or equal to 1). In a preferred embodiment, the Si-containing material forming the upper surface of the semiconductor substrate is Si, and the process gas used to perform the plasma etch is HBr, HBr with an addition of $O_2$, or $C_4F_8$, $NF_3$, and $CH_2F_2$. In an alternate preferred embodiment, the Si-containing material is SiN, and the process gas used to perform the plasma etch is $CH_3F$; $C_4F_8$, $NF_3$, and He; $C_4F_8$, $NF_3$, He, and $CH_2F_2$; $C_4F_8$, $NF_3$, He, $Ch_2F_2$, and $Cl_2$; or $C_4F_8$, $NF_3$, and $CH_2F_2$. In an alternate preferred embodiment, the Si-containing material is SiOx, wherein x is greater than or equal to 1, and the process gas used to perform the plasma etch is $CH_2F_2$ and $CF_4$; $C_4F_8$, $NF_3$, and He; $C_4F_8$, $NF_3$, He, $CH_2F_2$, $O_2$, and $CF_4$; $C_4F_8$, $NF_3$, He, and $O_2$; or $C_4F_8$, $NF_3$, He, and $CF_4$. In an embodiment, a passivation layer can be formed on portions of the upper surface of the semiconductor substrate during plasma etching. The process gas used to form the passivation layer during plasma etching preferably includes $C_4F_8$, He, $CF_4$, $CHF_3$, or a combination thereof. Preferably the pressure in the plasma etch chamber during plasma etching is maintained at about 5 mTorr to 90 mTorr. In an embodiment, the upper surface of the semiconductor substrate can be formed from more than one material, such as Si, SiN, and/or SiOx (wherein x is greater than or equal to 1) wherein the composition of the process gas used to perform the plasma etching can be optimized such that the etch rate of each material forming the upper surface is etched at a 1:1 ratio during plasma etching. For example, the upper surface of the semiconductor substrate can be formed from Si, SiN, and SiOx wherein the composition of the process gas is optimized such that each material is etched at a 1:1:1 ratio during plasma processing.

The method of planarizing the upper surface of the semiconductor substrate includes analyzing the upper surface of the semiconductor substrate thereby measuring non-uniformity of surface topography of the upper surface wherein the upper surface of the semiconductor substrate is formed from the Si-containing material. In a preferred embodiment, the topography of the upper surface of the semiconductor substrate is analyzed using a light scattering or interferometry technique. An amount of the Si-containing material to be removed from the upper surface of the semiconductor substrate is calculated based upon the analysis of the upper surface to achieve a planar upper surface of the semiconductor substrate after plasma etching the semiconductor substrate for a predetermined time. A desired temperature profile of spatial and temporal temperatures across the support surface of the substrate support assembly is generated. The desired temperature profile is preferably generated to correspond to desired temperatures across the upper surface of the semiconductor substrate required to remove the calculated amount of Si-containing material from the upper surface, wherein the etch rate of the Si-containing material forming the upper surface depends on the localized temperature thereof.

The semiconductor substrate is inserted into the plasma etch chamber. Process gas is supplied into the chamber and the process gas is energized into a plasma state. The upper surface of the semiconductor substrate is planarized by plasma etching the upper surface of the semiconductor substrate for the predetermined time while powering the array of independently controlled thermal control elements to achieve the desired temperature profile across the upper surface of the semiconductor substrate thereby removing the calculated amount of Si-containing material from the upper surface of the semiconductor substrate and achieving a planar upper surface of the semiconductor substrate.

In an embodiment of the method, a layer of Si-containing material can be deposited on the upper surface of the semiconductor substrate prior to inserting the semiconductor substrate in the plasma etch chamber wherein the plasma etch rate of the deposited Si-containing material depends on a localized temperature thereof. Preferably the layer of Si-containing material deposited on the upper surface of the semiconductor substrate prior to inserting the semiconductor substrate in the plasma etch chamber is SiN. In an embodiment, the upper surface of the semiconductor substrate can be subjected to a chemical mechanical planarization (CMP) process prior to inserting the semiconductor substrate in the plasma etch chamber. An exemplary embodiment of a chemical mechanical planarization apparatus can be found in commonly-assigned U.S. Pat. No. 6,769,961, which is hereby incorporated by reference in its entirety.

A control system, such as control system 385 (see FIG. 1) preferably controls processes performed by the plasma etch chamber, the substrate support assembly and/or control of the array of independently controlled thermal control elements. A non-transitory computer machine-readable medium can comprise program instructions for control of the plasma etch chamber and embodiments of methods disclosed herein wherein methods disclosed herein are preferably performed by a software algorithm. The computer program code for controlling the processing operations can be written in any conventional computer readable programming language: for example, assembly language, C, C++, Pascal, Fortran or others. Compiled object code or script is executed by a processor to perform the tasks identified in the program.

In an embodiment, the method of planarizing an upper surface of a semiconductor substrate in a plasma etch chamber wherein the upper surface of the semiconductor substrate is formed by a Si-containing material comprises supporting the semiconductor substrate on a support surface of a substrate support assembly that includes an array of independently controlled thermal control elements such as an array of at least 50 independently controlled thermal control elements. The thermal control elements of the array of independently controlled thermal control elements are operable to control the spatial and temporal temperature of the support surface of the substrate support assembly to form independently controllable heater zones. The independently controllable heater zones can be formed at a spatial frequency independent of the spatial frequency of the thermal control elements of the array of thermal control elements included in the substrate support assembly. In this manner, the independently controllable heater zones can be formed to correspond to a desired temperature profile across the upper surface of the semiconductor substrate wherein the etch rate across the upper surface of the semiconductor substrate during plasma etching depends on a localized temperature thereof and wherein the desired temperature profile is determined such that the upper surface of the semiconductor substrate is planarized within a predetermined time of plasma etching. The semiconductor substrate is plasma etched for the predetermined time thereby planarizing the upper surface thereof wherein the process gas used to perform the plasma etch includes HBr, $C_4F_3$, $NF_3$, $CH_2F_2$, $CF_4$, $CH_3F$, $O_2$, He, $Cl_2$, or a combination thereof.

Preferably, the desired temperature profile is created by analyzing the surface topography of the upper surface of the semiconductor substrate so as to determine nonuniformity of the upper surface topography thereof, and matching a temperature profile to the analyzed surface topography wherein the temperatures across the temperature profile are selected such that nonuniformity of the upper surface topography is reduced while plasma etching the semiconductor substrate. The surface topography of the upper surface of the semiconductor substrate is preferably analyzed using a light scattering or interferometry technique. Preferably the desired temperature profile is preferably created before supporting the semiconductor substrate on the support surface of the substrate support assembly in the plasma etch chamber. Alternatively, the desired temperature profile can be created after supporting the semiconductor substrate on the substrate surface of the substrate support assembly in the plasma etch chamber.

In an embodiment, a layer of Si-containing material can preferably be deposited on the upper surface of the semiconductor substrate before supporting the semiconductor substrate on the support surface of the substrate support assembly in the plasma etch chamber. Preferably the Si-containing material is SiN.

During plasma etching, the array of independently controlled thermal control elements are preferably controlled to form at least 100 independently controllable heater zones across the support surface such that the etch rate of portions of the upper surface of the semiconductor substrate corresponding to each formed independently controllable heater zone is about 0 to 5 nm/min/° C. For example, the temperatures of the independently controllable heater zones across the support surface of the substrate support assembly can achieve temperatures across the support surface of about 20° C. to about 90° C. In this manner, portions of the upper surface topography of the semiconductor substrate which are thicker (i.e. form peaks) than surrounding portions of the upper surface topography can be controlled to have a higher etch rate than the surrounding portions which are not as thick (i.e. form valleys). Thus, after a predetermined time of plasma etching, wherein portions of the upper surface are etched at different rates, wherein the etch rates depend on a localized temperature of the upper surface of the semiconductor substrate, a planarized upper surface of the semiconductor substrate can be achieved. Preferably during the plasma etching, the pressure in the plasma etch chamber is maintained at about 5 mTorr to 90 mTorr.

FIGS. 3A-3C each illustrate a cross-sectional view of a semiconductor substrate during steps of an embodiment of a method of planarizing an upper surface of a semiconductor substrate as disclosed herein. As shown in FIG. 3A, the upper surface 400 of the semiconductor substrate 100 has a nonuniform surface topography wherein the upper surface 400 is formed of a Si-containing material. In a preferred embodiment, the upper surface 400 is subjected to a chemical mechanical planarization (CMP) process which thereby reduces the nonuniformity of the surface topography of the upper surface 400. The upper surface 400 is then analyzed such that the surface topography of the upper surface 400 is measured, and an amount of material to be removed from the upper surface 400 of the substrate 100 to achieve a planar upper surface 400 thereof after plasma etching the substrate 100 for a predetermined time is calculated. A temperature profile of spatial and temporal temperatures across the support surface of the substrate support assembly which corresponds to desired temperatures across the upper surface 400 of the semiconductor substrate 100 is generated. The substrate 100 is then inserted into the plasma etch chamber, wherein independently controllable heater zones are formed to correspond to the generated temperature profile by an array of independently controlled thermal control elements disposed within the substrate support assembly. For example, as shown in FIG. 3B, the independently controllable heater zones 401A can be formed by the array of independently controlled thermal control elements wherein the temperatures of the independently controllable heater zones 401A facilitate a faster etch rate, and independently controllable heater zones 401B can be formed by the array of independently controlled thermal control elements wherein the temperatures of the independently controllable heater zones 401B facilitate a slower etch rate. The upper surface 400 of the semiconductors substrate 100 is then plasma etched for the predetermined time while powering the array of independently controlled thermal control elements to form the independently controllable heater zones to correspond to the generated temperature profile, thus achieving a planar upper surface 400, as illustrated in FIG. 3C.

FIGS. 4A-4D each illustrate a cross-sectional view of a semiconductor substrate during steps of an embodiment of a method of planarizing an upper surface of a semiconductor substrate as disclosed herein. As shown in FIG. 4A, the upper surface 400 of the semiconductor substrate 100 has a nonuniform surface topography wherein the upper surface 400 is formed of a Si-containing material. In a preferred embodiment, a layer of SiN is deposited on the upper surface 400 forming a new upper surface 400a which also has a nonuniform surface topography. The upper surface 400a formed by SiN is then analyzed such that the surface topography of the upper surface 400a is measured, and an amount of material to be removed from the upper surface 400a of the substrate 100 to achieve a planar upper surface 400a thereof after plasma etching the substrate 100 for a predetermined time is calculated. A temperature profile of spatial and temporal temperatures across the support surface of the substrate support assembly which corresponds to desired temperatures across the upper surface 400a of the semiconductor substrate 100 is generated. The substrate 100 is then inserted into the plasma etch chamber, wherein independently controllable heater zones (not shown) are formed to correspond to the generated temperature profile by an array of independently controlled thermal control elements disposed within the substrate support assembly. The upper surface 400a of the semiconductors substrate 100 is then plasma etched for the predetermined time wherein a planar upper surface 400a, as illustrated in FIG. 4C, is achieved. The semiconductor substrate 100 is then plasma etched until the deposited layer of SiN is fully removed, thus exposing a planar upper surface 400 formed from the underlying Si-containing material.

While the invention has been described in detail with reference to specific embodiments thereof, it will be apparent to those skilled in the art that various changes and modifications can be made, and equivalents employed, without departing from the scope of the appended claims.

What is claimed is:

1. A method of planarizing an upper surface of a semiconductor substrate in a plasma etch chamber wherein the semiconductor substrate is supported on a support surface of a substrate support assembly located in the plasma etch chamber, the substrate support assembly including an array of independently controlled thermal control elements therein wherein the thermal control elements of the array of independently controlled thermal control elements are operable to control the spatial and temporal temperature of the support surface of the substrate support assembly to form independently controllable heater zones to correspond to a desired temperature profile across the upper surface of the semiconductor substrate such that the etch rate across the upper surface of the semiconductor substrate can be controlled during plasma etching so that the upper surface of the semiconductor substrate may be planarized, the method comprising:

analyzing the upper surface of the semiconductor substrate thereby measuring nonuniformity of surface topography of the upper surface wherein the upper surface is formed by a Si-containing material;

calculating an amount of the Si-containing material to remove from the upper surface of the semiconductor substrate based upon the analysis of the upper surface to achieve a planar upper surface of the semiconductor substrate after plasma etching the semiconductor substrate for a predetermined time;

generating a temperature profile of the spatial and temporal temperatures across the support surface of the substrate support assembly which corresponds to desired temperatures across the upper surface of the semiconductor substrate required to remove the calculated amount of the Si-containing material from the upper surface, wherein the etch rate of the Si-containing material forming the upper surface depends on the localized temperature thereof;

inserting the semiconductor substrate into the plasma etch chamber;

supplying process gas into the chamber and energizing the process gas into a plasma state; and planarizing the upper surface of the semiconductor substrate by plasma etching the upper surface of the semiconductor substrate while powering the array of independently controlled thermal control elements to achieve the desired temperature profile across the upper surface of the semiconductor substrate thereby removing the calculated amount of the Si-containing material from the upper surface of the semiconductor substrate and achieving a planar upper surface of the semiconductor substrate.

2. The method of claim 1, wherein (a) the Si-containing material is Si, and the process gas used to perform the plasma etch is HBr; or (b) the Si-containing material is Si, and the process gas used to perform the plasma etch is HBr and Q; or (c) the Si-containing material is Si, and the process gas used to perform the plasma etch is $C_4F_8$, $NF_3$, and $CH_2F_2$; or (d) the Si-containing material is SiN, and the process gas used to perform the plasma etch is $CH_3F$; or (e) the Si-containing material is SiN, and the process gas used to perform the plasma etch is $C_4F_8$, $NF_3$, and $CH_2F_2$; or (f) the Si-containing material is SiN, and the process gas used to perform the plasma etch is $C_4F_8$, $NF_3$, and He; or (g) the Si-containing material is SiN, and the process gas used to perform the plasma etch is $C_4F_8$, $NF_3$, He, and $CH_2F_2$; or (h) the Si-containing material is SiN, and the process gas used to perform the plasma etch is $C_4F_8$, $NF_3$, He, $CH_2F_2$, and or (i) the Si-containing material is SiO$_x$, wherein x is greater than or equal to 1, and the process gas used to perform the plasma etch is CH$_2$F$_2$ and CF$_4$; or (j) the Si-containing material is SiO$_x$, wherein x is greater than or equal to 1, and the process gas used to perform the plasma etch is C$_4$F$_8$, NF$_3$, and He; or (k) the Si-containing material is SiO$_x$, wherein x is greater than or equal to 1, and the process gas used to perform the plasma etch is C$_4$F$_8$, NF$_3$, He, CH$_2$F$_2$, O$_2$, CF$_4$; or (l) the Si-containing material is SiO$_x$, wherein x is greater than or equal to 1, and the process gas used to perform the plasma etch is C$_4$F$_8$, NF$_3$, He, and O$_2$; or (m) the Si-containing material is SiO$_x$, wherein x is greater than or equal to 1, and the process gas used to perform the plasma etch is C$_4$F$_8$, NF$_3$, He, and CF$_4$.

3. The method of claim 1, further comprising depositing a layer of the Si-containing material on the upper surface of the semiconductor substrate prior to inserting the semiconductor substrate in the plasma etch chamber wherein the plasma etch rate of the deposited Si-containing material depends on a localized temperature thereof; and/or subjecting the upper surface to a chemical mechanical planarization process prior to inserting the semiconductor substrate in the plasma etch chamber.

4. The method of claim 1, wherein the upper surface of the semiconductor surface is formed by more than one material selected from the group consisting of Si, SiN, and SiO$_x$, wherein x is greater than or equal to 1, the method further comprising optimizing the composition of the process gas such that each material forming the upper surface of the semiconductor substrate is etched at a 1:1 ratio during plasma processing.

5. The method of claim 1, wherein the temperatures of the independently controllable heater zones across the support surface of the substrate support assembly can achieve temperatures across the support surface of about 20° C. to about 90° C.

6. The method of claim 1, further comprising maintaining a pressure in the chamber at about 5 mTorr to 90 mTorr.

7. The method of claim 1, wherein the process gas used to perform the plasma etching includes C$_4$F$_8$, He, CF$_4$, CHF$_3$, or a combination thereof, and wherein the plasma etching forms a passivation layer on portions of the upper surface of the semiconductor substrate.

8. The method of claim 1, wherein the topography of the upper surface of the semiconductor substrate is analyzed using a light scattering or interferometry technique.

9. The method of claim 1, wherein the desired temperature profile and the independently controllable heater zones are formed at a spatial frequency independent of the spatial frequency of the thermal control elements of the array of independently controlled thermal control elements included in the substrate support assembly.

10. The method of claim 1, further comprising controlling the array of independently controlled thermal control elements to form at least 100 independently controllable heater zones across the support surface such that the etch rate of portions of the upper surface of the semiconductor substrate corresponding to each formed independently controllable heater zone is about 0 to 5 nm/min/° C.

11. The method of claim 1, wherein the method is performed by a software algorithm.

12. A non-transitory computer readable medium comprising program instructions for performing the method of claim 1.

13. A control system configured to control processes performed by the plasma etch chamber comprising the non-transitory computer readable medium of claim 12.

14. A method of planarizing an upper surface of a semiconductor substrate in a plasma etch chamber wherein the upper surface of the semiconductor substrate is formed by a Si-containing material, the method comprising:

analyzing the upper surface of the semiconductor substrate so as to determine nonuniformity of surface topography of the upper surface;

calculating an amount of the Si-containing material to remove from the upper surface of the semiconductor substrate based upon the analysis of the upper surface;

supporting the semiconductor substrate on a support surface of a substrate support assembly that includes an array of independently controlled thermal control elements therein wherein the thermal control elements of the array of independently controlled thermal control elements are operable to control the spatial and temporal temperature of the support surface of the substrate support assembly to form independently controllable heater zones;

controlling the independently controllable heater zones to correspond to a desired temperature profile across the upper surface of the semiconductor substrate for the analyzed surface topography wherein the etch rate across the upper surface of the semiconductor substrate during plasma etching depends on a localized temperature thereof and wherein the desired temperature profile is determined such that the upper surface of the semiconductor substrate is planarized within a predetermined time period; and plasma etching the semiconductor substrate for the predetermined time period thereby planarizing the upper surface thereof to remove the calculated amount of the Si-containing material from the upper surface of the semiconductor substrate, wherein the process gas used to perform the plasma etch includes HBr, C$_4$F$_8$, NF$_3$, C$_2$F$_2$, CF$_4$, CH$_3$F, O$_2$, He, Cl$_2$, or a combination thereof.

15. The method of claim 14, wherein the desired temperature profile is created before supporting the semiconductor substrate on the support surface of the substrate support assembly in the plasma etch chamber.

16. The method of claim 15, wherein the desired temperature profile and the independently controllable heater zones are controlled at a spatial frequency independent of the spatial frequency of the thermal control elements of the array of independently controlled thermal control elements included in the substrate support assembly.

17. The method of claim 14, further comprising depositing a layer of the Si-containing material on the upper surface of the semiconductor substrate before supporting the semiconductor substrate on the support surface of the substrate support assembly in the plasma etch chamber.

18. The method of claim 14, further comprising, controlling the array of independently controlled thermal control elements to form at least 100 independently controllable heater zones across the support surface such that the etch rate of portions of the upper surface of the semiconductor substrate corresponding to each formed independently controllable heater zone is about 5 nm/min/° C. or less.

19. The method of claim 14, wherein the temperatures of the independently controllable heater zones across the support surface of the substrate support assembly can achieve temperatures across the support surface of about 20° C. to about 90° C., and/or the pressure in the chamber is maintained at about 5 mTorr to 90 mTorr.

20. The method of claim 14, wherein the array of independent control elements includes at least 50 thermal control elements.

* * * * *